United States Patent [19]

Okada et al.

[11] Patent Number: 5,574,314
[45] Date of Patent: Nov. 12, 1996

[54] PACKAGED SEMICONDUCTOR DEVICE INCLUDING SHIELDED INNER WALLS

[75] Inventors: Masaaki Okada; Tosio Usuki, both of Itami, Japan

[73] Assignee: Mitsubishi Denki Kabushiki Kaisha, Tokyo, Japan

[21] Appl. No.: 503,342

[22] Filed: Jul. 17, 1995

[30] Foreign Application Priority Data

Jul. 28, 1994 [JP] Japan .................................. 6-176701

[51] Int. Cl.⁶ ............................. H01L 23/60; H01L 23/12
[52] U.S. Cl. .......................... 257/728; 257/664; 257/704; 257/703; 257/659; 257/730; 257/790; 257/698
[58] Field of Search .................................. 256/666, 675, 256/684, 685, 699, 698, 703, 704, 706, 707, 708–710, 730, 787–790, 796, 659; 257/728, 664

[56] References Cited

U.S. PATENT DOCUMENTS

| 4,427,991 | 1/1984 | Yamamura et al. | 257/728 |
| 4,698,661 | 10/1987 | Bessonneau et al. | 257/664 |
| 4,908,694 | 3/1990 | Hidaka et al. | 257/709 |
| 5,031,069 | 7/1991 | Anderson | 257/703 |
| 5,367,196 | 11/1994 | Mahulikar et al. | 257/709 |

FOREIGN PATENT DOCUMENTS

| 0065443 | 4/1982 | European Pat. Off. | 23/56 |
| 331289 | 9/1989 | European Pat. Off. | 257/659 |
| 64-89548 | 6/1964 | Japan . | |
| 55-95343 | 7/1980 | Japan | 257/703 |
| 57-78156 | 5/1982 | Japan | 257/703 |
| 63-207157 | 8/1988 | Japan | 257/708 |
| 1231356 | 9/1989 | Japan . | |
| 287701 | 3/1990 | Japan . | |
| 4-92461 | 3/1992 | Japan | 257/659 |
| 0152455 | 6/1993 | Japan | 257/728 |

*Primary Examiner*—Robert P. Limanek
*Assistant Examiner*—Alexander Oscar Williams
*Attorney, Agent, or Firm*—Leydig, Voit & Mayer

[57] ABSTRACT

A semiconductor device including a metal base; a first ceramic frame bonded to the metal base; a metallization layer for I/O terminals disposed on the first ceramic frame; a second ceramic frame larger than the first ceramic frame and bonded to the first ceramic frame and to the metallization layer; a metal disposed on and covering inner side walls of the first and second ceramic frames, not electrically contacting the metallization layer but electrically contacting the base member; a semiconductor element disposed on the base member within the first ceramic frame, having I/O terminals connected to the metallization layer, and having a grounding terminal connected to the base member; and a cover hermetically sealing the semiconductor element, bonded to the second ceramic frame, and electrically connected to the metal disposed on the inner side walls.

10 Claims, 5 Drawing Sheets

5,574,314

PACKAGED SEMICONDUCTOR DEVICE INCLUDING SHIELDED INNER WALLS

FIELD OF THE INVENTION

The present invention relates to a semiconductor device and, more particularly, it relates to a semiconductor device for high frequency, high output power operation.

BACKGROUND OF THE INVENTION

FIG. 8 is a perspective view showing a structure of a semiconductor device disclosed in Japanese Published Patent Application No. Sho. 64-89548. Referring to FIG. 8, a top ceramic frame 102 is calcined and mounted to a base ceramic 101. The package includes input and output leads 103 and 104, respectively, grounding leads 105 and 106 silver-soldered onto a grounding metallization layer 117 on the base ceramic 101, a semiconductor element 107 bonded to the grounding metallization layer 117 on the base ceramic 101, and a wire 108 formed of copper or the like electrically connecting an electrode (not shown) on the semiconductor element 107 to a metallization layer 116 for I/O terminals. A metallization layer 110 is provided on the top ceramic frame 102, cover 115 formed of metal is bonded to the metallization layer 110 by soldering or the like. In addition, inner and outer side wall metallizations 109a and 109b are provided on the inner and outer side walls of the top ceramic frame 102 over the grounding metallization layer 117, and a metallization layer 118 is provided on a back surface of the base ceramic 101. The semiconductor element 107 is connected to the metallization layer 118 through the grounding metallization layer 117 and a grounding metallization layer 112 on a side wall of the base ceramic 101 so as to be grounded. A metallization layer 116 provided on the base ceramic 101 is formed of a micro-wave strip line with a predetermined impedance. In addition, the width of the I/O leads 103 and 104 connected to the metallization layer 116 is the same as that of the metallization layer 116.

Next, an operation thereof will be described. A high-frequency input signal is input through the input lead 103 to the metallization layer 116 formed on the base ceramic 101, that is, the micro-wave strip line which can be used at the predetermined high frequency, and then input to the semiconductor element 107 through the wires 108. An output signal from the semiconductor element 107 is output to an external circuit (not shown) through the wires 108, the metallization layer 116 formed on the base ceramic 101, that is, the micro-wave strip line and the output lead 104.

Next, description will be given of a package. Since most of packages used in the conventional semiconductor device are entirely made of ceramic, the resonant frequency of the package is lowered and when it is used in a high-frequency semiconductor device, its characteristics are degraded. Therefore, lowering of the resonance frequency is prevented by providing the metallization layer 109a for electromagnetic shielding on the inner surface of the top ceramic 102 in the above-described semiconductor device.

Thus, according to the conventional semiconductor device of the above structure, since the base substrate is formed of ceramic having low heat conduction and undesirable heat dissipation properties, heat generated from the semiconductor element can not be effectively dissipated, which could cause destruction of the semiconductor element.

SUMMARY OF THE INVENTION

It is an object of the present invention to easily provide a semiconductor device having preferable heat dissipation properties at the time of high-output operation and with good high-frequency characteristics.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a first ceramic frame, which is bonded to a metal base member; a metallization layer for I/O terminals, located on the first ceramic frame; a second ceramic frame larger than the first ceramic frame, and bonded to the first ceramic frame and to the metallization layer; a metal disposed on and covering inner side walls of the first and second ceramic frames, not electrically in contact with the metallization layer but electrically in contact with the base member; a semiconductor element on the base member in the first ceramic frame with I/O terminals connected to the metallization layer and grounding terminals connected to the base member; and a cover hermetically sealing the semiconductor element, bonded to the second ceramic frame and electrically connected to the metal material disposed on the inner side walls. Thus, since the first and second ceramic frames are bonded to the metal base member, the metal material electrically connected to the metal base is disposed on the inner side walls so as to cover the inner side walls, the semiconductor element is disposed on the metal base member, and the semiconductor element is sealed by the sealing cover, there is provided a semiconductor device having preferable high-frequency characteristics and capable of effectively dissipating heat generated in the semiconductor element at the time of high-output operation.

According to a second aspect of the present invention, in the semiconductor device, since metal covers the inner side walls of the first and second ceramic frames, there can be provided a semiconductor device having preferable high-frequency characteristics and capable of effectively dissipating heat generated in the semiconductor element at the time of high-output operation.

According to a third aspect of the present invention, in the semiconductor device, since the metal member and the hermetic sealing cover are integrally formed, there can be easily provided a semiconductor device having excellent high-frequency characteristics and excellent heat dissipation properties at the time of high-output operation.

According to a fourth aspect of the present invention, in the semiconductor device, since the metal member is disposed on the first and second ceramic frames by bonding through a bonding agent, a difference in expansion coefficients between the first and second ceramic frames and the metal member is adjusted, whereby the semiconductor device is prevented from being destroyed. Thus, there can be provided a semiconductor device having high reliability with a change in temperature and having preferable high-frequency characteristics.

According to a fifth aspect of the present invention, in the semiconductor device, since the metal member is electrically connected to the base member by bonding through an electrically conductive bonding agent, any contact defect caused by a difference in expansion coefficient between the metal member and the base substrate is prevented, whereby there can be provided a semiconductor device having high reliability with a change in temperature and having preferable high-frequency characteristics.

DETAILED DESCRIPTION OF THE PREFERRED EMBODIMENTS

Embodiment 1

Figure 1:
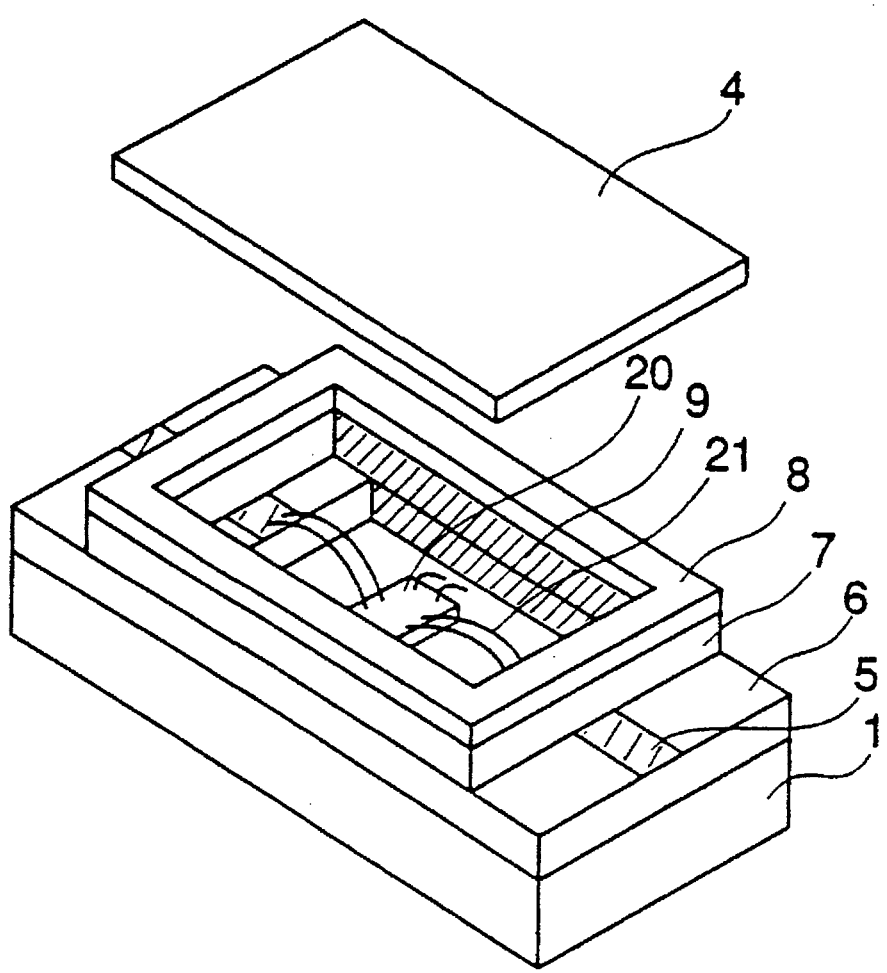
FIG. 1 is a perspective view of a semiconductor device according to a first embodiment of the present invention.

FIG. 1 is a perspective view showing a state where a cover for shielding a package is taken off for describing a structure of a semiconductor device according to a first embodiment of the present invention. Referring to FIG. 1, a base member 1 is made of metal having high heat conductivity such as Cu, Cu-W or Cu-Mo-Cu which serves as a heat sink and a grounding conductor. A lower ceramic frame 6 is made of a non-conductive material such as alumina or aluminum nitride, on which a metallization layer 5 for I/O terminals, comprising an Ni layer and an Au layer, is provided. An upper ceramic frame 7 made of a material such as alumina or aluminum nitride is disposed on the lower ceramic frame 6, a seal ring 8 made of a material such as Fe-Ni and related alloys or Cu and related alloys is disposed on the upper ceramic frame 7, a cover 4 for sealing a package, which is made of a material such as Fe-Ni and related alloys or Cu and related alloys is disposed on the seal ring 8 so as to seal the semiconductor device, a semiconductor element 20 is mounted in the package comprising the base member 1, the lower ceramic frame 6, the upper ceramic frame 7, the seal ring 8 and the cover 4, and a wire 21 is made of a material such as copper. In addition, a metallization layer 9 is located on the inner walls of the upper ceramic frame 7 and the lower ceramic frame 6 in a direction parallel to the metallization layer 5 for the I/O terminals, which metallization layer 9 is connected to a base substrate 1.

Figure 2:
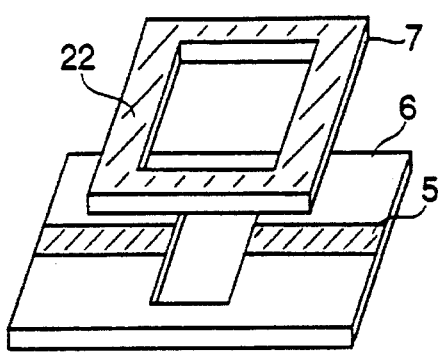
FIGS. 2(a)–2(f) show a flow and a manufacturing flowchart for describing a method of manufacturing the semiconductor device according to the first embodiment of the present invention.
Figure 2:
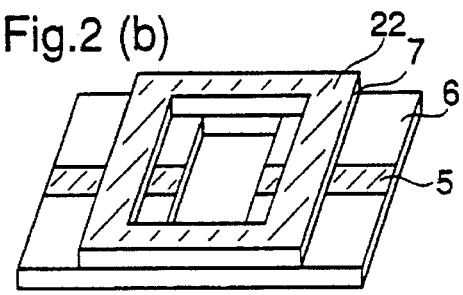
Figure 2:
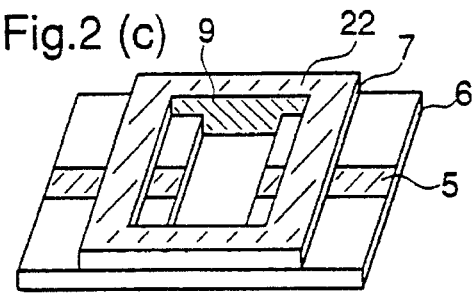
Figure 2:
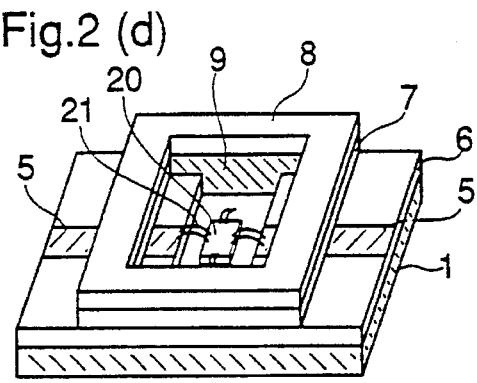
Figure 2:
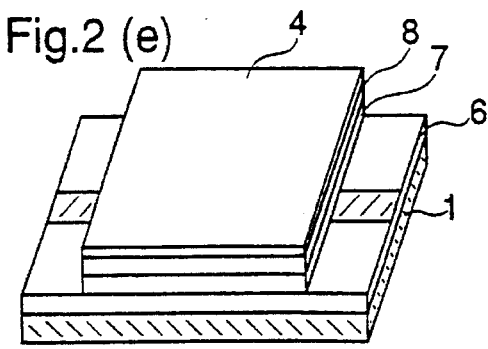
Figure 2:
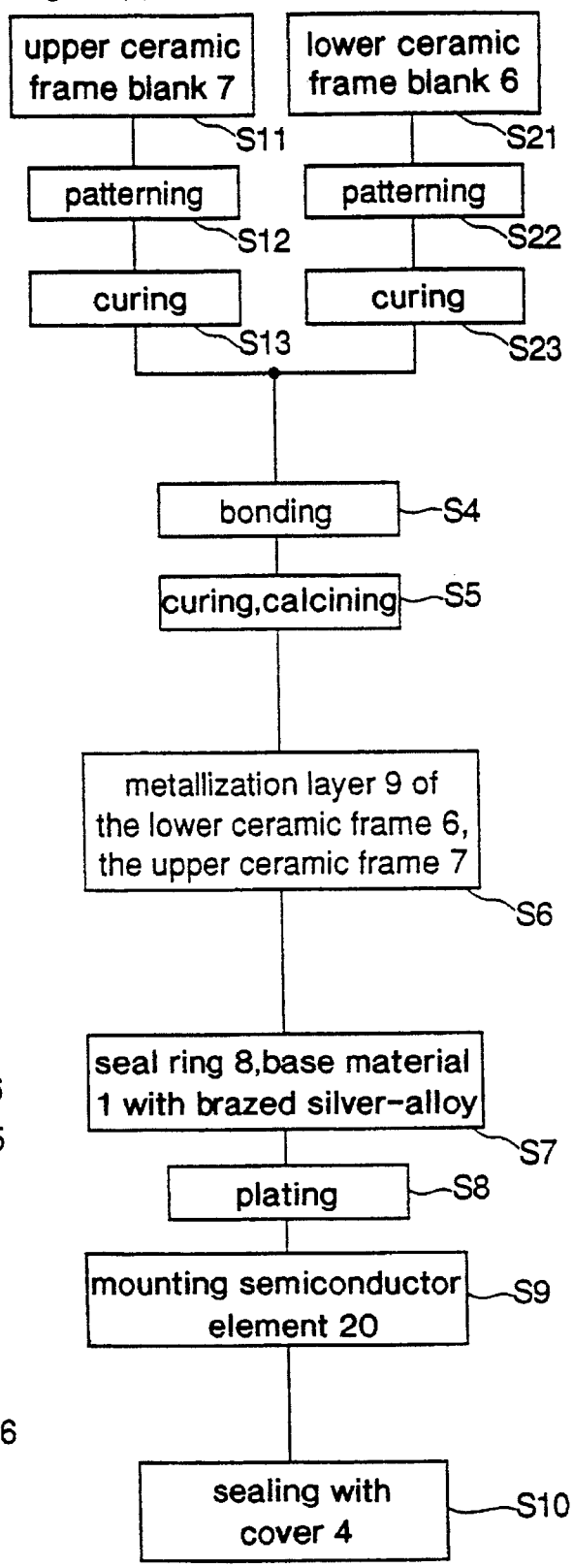

FIGS. 2(a)–2(e) are perspective views showing a method of manufacturing a semiconductor device according to the first embodiment of the present invention and FIG. 2(f) is a flowchart thereof. Referring to FIGS. 2(a)–2(f), the same reference numbers as in FIG. 1 designate the same or corresponding parts. In addition, a metallization layer 22 is provided on an upper surface of the upper ceramic frame 7, on which the seal ring 8 is mounted.

Next, the manufacturing method will be described. First, referring to FIG. 2(a), two green sheet-shaped ceramics blanks (S11, S21) are formed and then, the metallization layer 5 for the I/O terminals and the metallization layer 22 are formed on the respective surfaces thereof by patterning (S12, S22). Then, the metallizations are cured (S13, S23) and then, there are provided the lower ceramic frame 6 serving as a first side wall member and the upper ceramic frame 7 serving as a second side wall member.

Then, the green lower ceramic frame 6 and upper ceramic frame 7 are bonded together (S4) and the bonding part is cured and calcined (FIG. 2(b), S5). Then, referring to FIG. 2(c), the metallization layer 9 comprising Ni and Au or the like is formed by photolithography on the surface of the inner wall of the upper ceramic frame 7 and lower ceramic frame 6 in a direction parallel to the metallization layer 5 (S6).

Then, the seal ring 8 made of Fe-Ni and related alloys is silver-alloy brazed onto the upper ceramic frame 7 (S7) and then, the base material 1 is mounted on the lower surface of the lower ceramic frame 6. Then, a metal part is plated with Ni and Au or the like so that the seal ring 8, the metallization layer 9 and the base material 1 are electrically connected (S8) and then, the semiconductor element 20 is mounted on the base member 1 (FIG. 2(d), S9). Then, a grounding terminal (not shown) of the semiconductor element 20 is connected to the base member 1 and the I/O terminals (not shown) are connected to the metallization layer 5, the I/O terminals, by wires 21. Thereafter, the semiconductor element is hermetically sealed by the cover 4 for sealing the package (S10), whereby the semiconductor device shown in FIG. 2(e) is completed.

Next, an operation will be described. A high-frequency input signal is input from the input terminal of the metallization layer 5 to the semiconductor element through the wires 21. An output signal from the semiconductor element 20 is output from the output terminal of the metallization layer 5 through the wires 21. In addition, the grounding terminal (not shown) of the semiconductor element 20 is connected to the metal base 1 through the wires 21 and grounded.

Next, a description will be given to a package. According to the semiconductor device of this embodiment of the present invention, the side wall of the package consists of the lower ceramic frame 6 and the upper ceramic frame 7, the metallization layer 9 on the inner side wall of the lower ceramic 6 and the upper ceramic frame 7, and connected to the metal base 1, whereby the inside of the package for the semiconductor element is in the form of a waveguide. Consequently, the electromagnetic sealing effect of the package is improved and degradation of high-frequency characteristics, such as a lowering of resonance frequency, which occurs in high-frequency operation when the side wall of the package is formed of the ceramic only is avoided.

According to this embodiment of the present invention, the base member 1 to which the semiconductor element 20 is mounted is made of a metal such as Cu or Cu-W having a high heat conductivity. Therefore, heat dissipation properties of the base member 1 are preferable and heat generated from the semiconductor element 20 at the time of high-output operation can be effectively dissipated from the package, whereby deterioration of the semiconductor element 20 caused by heat can be prevented.

Thus, according to the first embodiment of the present invention, since the base member 1 to which the semiconductor element 20 is mounted is made of metal having high heat conductivity, there can be provided a semiconductor device having preferable heat dissipation properties and high-frequency characteristics at the time of high-output operation.

Figure 3:
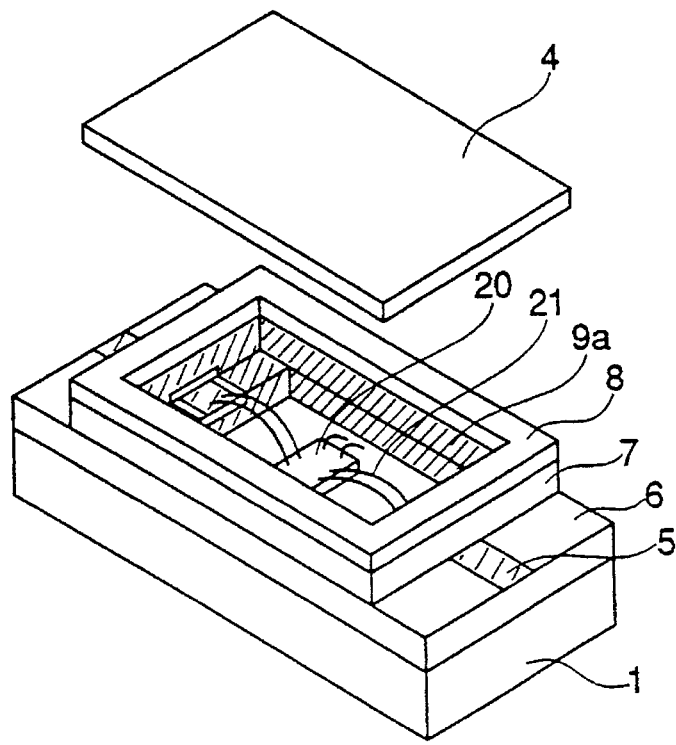
FIG. 3 is a perspective view of a semiconductor device according to a modification of the first embodiment of the present invention.

In addition, although the metallization layer comprising Ni and Au is formed by photolithography on the whole inner surface which parallels the metallization layer for the I/O terminals of the upper and lower ceramic frames in order to improve the electromagnetic shielding effect of the package according to the first embodiment of the present invention. As shown in FIG. 3, an electromagnetic shielding metallization layer 9a may be provided on the whole inner surface except for a part in the vicinity of the metallization layer for the I/O terminals so as not be in contact that metallization layer. In this case, the electromagnetic shielding effect can be further improved.

Embodiment 2

Figure 4:
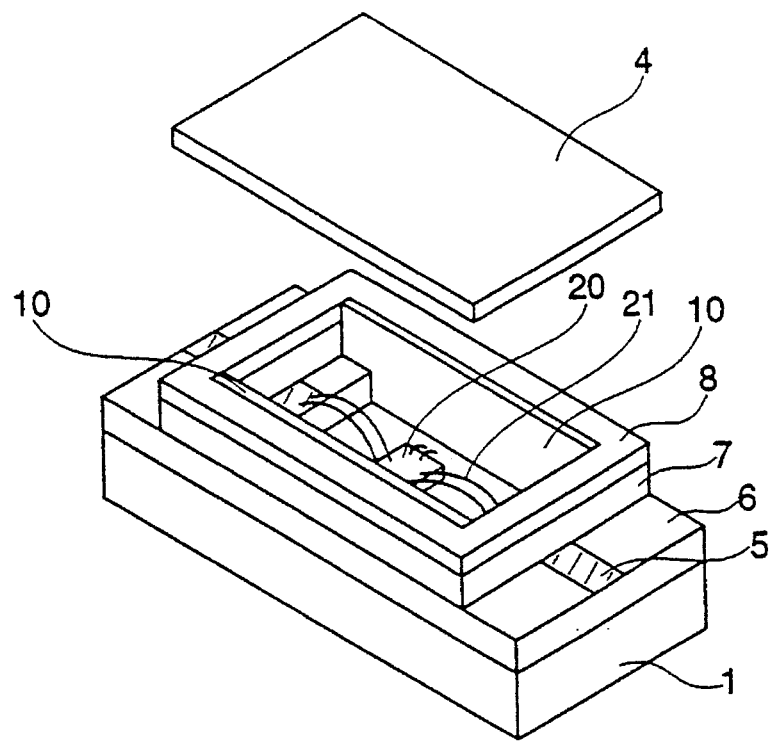
FIG. 4 is a perspective view of a semiconductor device according to a second embodiment of present invention.

FIG. 4 is a perspective view showing a state in which the package sealing cover is removed, for describing a structure of a high-frequency semiconductor device according to a second embodiment of the present invention. Referring to FIG. 4, the same reference numbers as in FIG. 1 designate the same or corresponding parts. In addition, a metal plate 10 of Fe-Ni and related alloys or Cu and related alloys.

In the first embodiment, the metallization layer 9 comprising Ni and Au is formed by photolithography on the inner surface of the upper and lower ceramic frames 7 and 6 in order to improve the electromagnetic shielding effect of the package of the semiconductor device. In this case, however, in order to form the metallization layer, after the upper and lower ceramic flames 7 and 6 are superimposed and bonded, the metallization layer 9 is formed on the inner side wall thereof, the seal ring 8 and the metal base 1 are mounted, and then, plating for connecting the metallization layer 9 on the inner side wall to the base member 1 or the like, that is, metallizing is performed. Thus, the metallizing has to be performed twice, so that manufacturing process becomes very complicated. According to the semiconductor device of the second embodiment of the present invention, in order to solve the above problem, a metal plate is bonded to the inner side wall instead of forming the metallization layer on the inner side wall.

More specifically, according to the second embodiment of the present invention, the T-plate metal member 10 which fits in and contacts the inner side wall in a direction parallel to the metallization layer 5 for the I/O terminals of the package comprising the lower and upper ceramic frames 6 and 7 and the seal ring 8 is previously prepared, and the lower and upper ceramic frames 6 and 7 are bonded, the seal ring 8 and the base member 1 are bonded to the ceramic frames 6 and 7. Then, the metal plate 10 is silver-alloy brazed along the inner side wall of the lower and upper ceramic frames 6 and 7 and the seal ring 8 and then, the metal plate 20 and the base member 1 are bonded by brazing, soldering or the like. Then, the semiconductor element 20 is mounted and the package is sealed by the cover 4, whereby the semiconductor device is provided.

Thus, according to the second embodiment of the present invention, the same effect as in the first embodiment of the present invention is produced and since the metal plate 10 is attached to the inner side wall of the package, the metallizing process during formation of the package is simplified as compared with the first embodiment, whereby a semiconductor device having a high electromagnetic shielding effect and preferable high-frequency characteristics can be easily provided.

Figure 5:
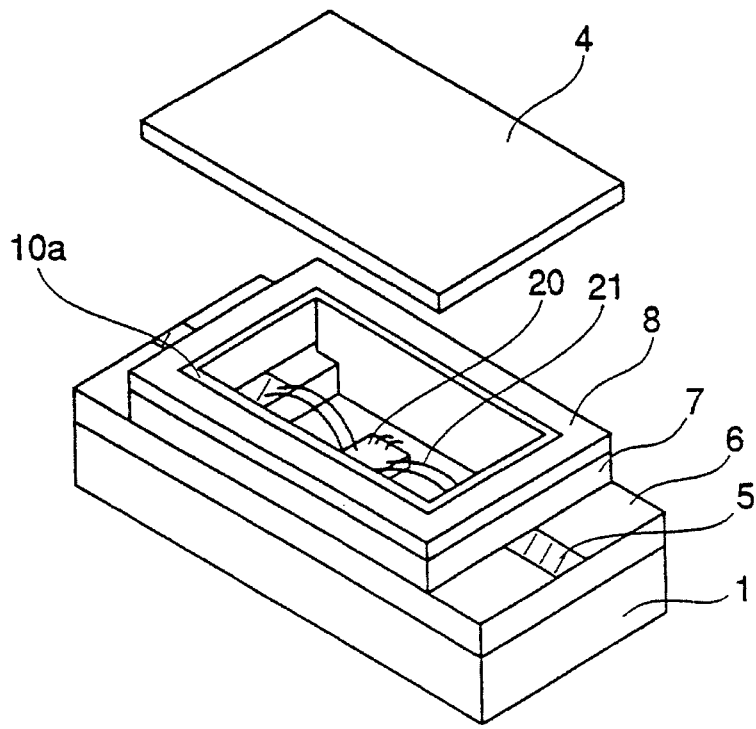
FIG. 5 is a perspective view of a semiconductor device according to a modification of the second embodiment of the present invention.

In addition, although the metal plate 10 is attached to the inner side wall of the package in the second embodiment of the present invention, a frame member 10a made of metal may be fit in the inner side wall of the package instead of the metal plate as shown in FIG. 5. In this case, the frame member 10a has a configuration such that there is a space between the frame member 10a and the metallization layer 5 and the frame member 10a is not in contact with it when fit in the inner side wall of the package. In this case, since a shield made of metal and connected to the base member can be also provided on the side wall faces in a direction perpendicular to the metallization layer 5, the electromagnetic shielding effect can be further improved.

Meanwhile, Japanese Published Patent Application No. Hei. 1-231356 discloses a semiconductor device in which one pair of opposite faces of a side wall of a package is formed of metal and the other pair of opposite faces of the side wall is formed of ceramic, and the metal side wall is electrically connected to a metal plate on which the semiconductor element is mounted. According to the Published Patent Application, although the metal side wall and the ceramic side wall of the package are bonded, since the heat expansion coefficient of the metal is different from that of the ceramic, a bonded part between the ceramic plate and the metal plate of the side wall is moved by heat expansion, causing a damage of the hermetic properties of the package. Therefore, semiconductor device is not practical as a high-output semiconductor device which is likely to generate heat. Meanwhile, according to the semiconductor device of the present invention, since the metal plate is attached to the frame-shaped side wall formed of ceramic, the bonded part between the ceramic plate and the metal plate is not moved at the time of high-output operation so that its hermetic properties are not damaged, whereby there can be provided a semiconductor device having high reliability and high-frequency characteristics at the time of high-output operation.

Embodiment 3

Figure 6:
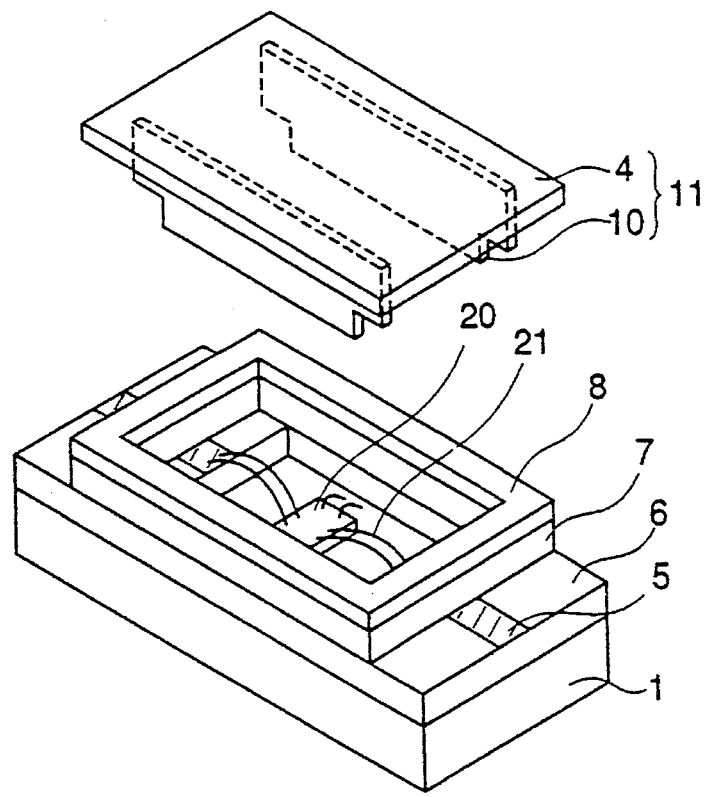
FIG. 6 is a perspective view of a semiconductor device according to a third embodiment of the present invention.

FIG. 6 is a perspective view for describing a structure of a semiconductor device according to a third embodiment of the present invention. Referring to FIG. 6, the same reference numbers as in FIG. 4 designate the same or corresponding parts. In addition, an integral member 11 comprises the cover 4 for sealing the package and the metal plate 10 connected to the cover 4 by soldering or using a conductive bonding agent.

Although the metal plate 10 is fit in as shown in FIG. 4 and then, the package is sealed by the cover 4 in the above second embodiment of the present invention, the integral member 11 is previously formed by bonding the cover 4 to the metal plate 10 and the package is sealed by the cover 4 at the same time when the metal plate 10 is fit in the side wall of the package.

According to the third embodiment of the present invention, since the integral member is previously provided, the number of parts of the semiconductor device can be reduced and position alignment needed when the package is sealed by the cover is not necessary, the manufacturing process of the semiconductor device can be simplified.

Figure 7:
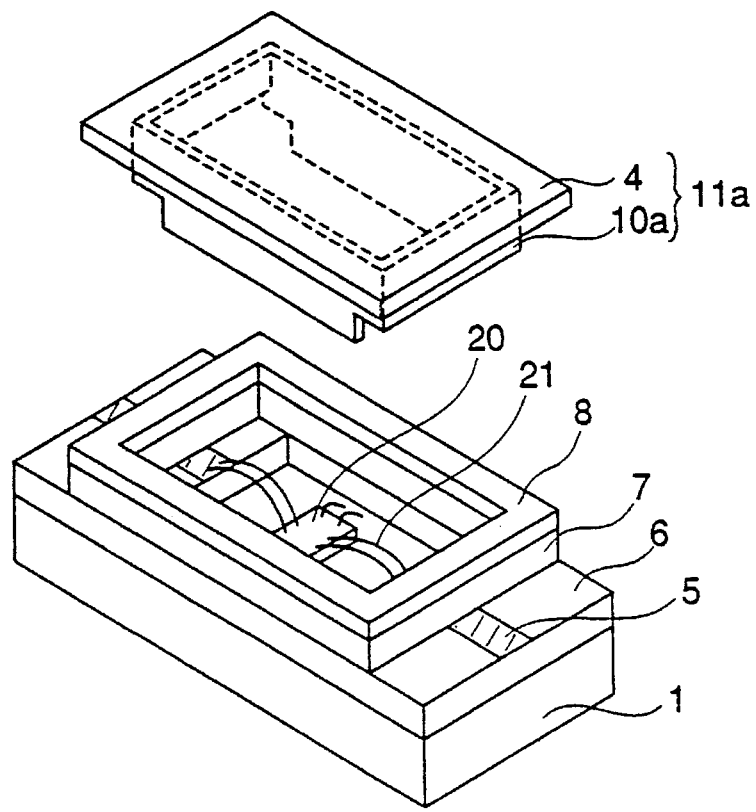
FIG. 7 is a perspective view of a semiconductor device according to a modification of the second embodiment of the present invention.
Figure 8:
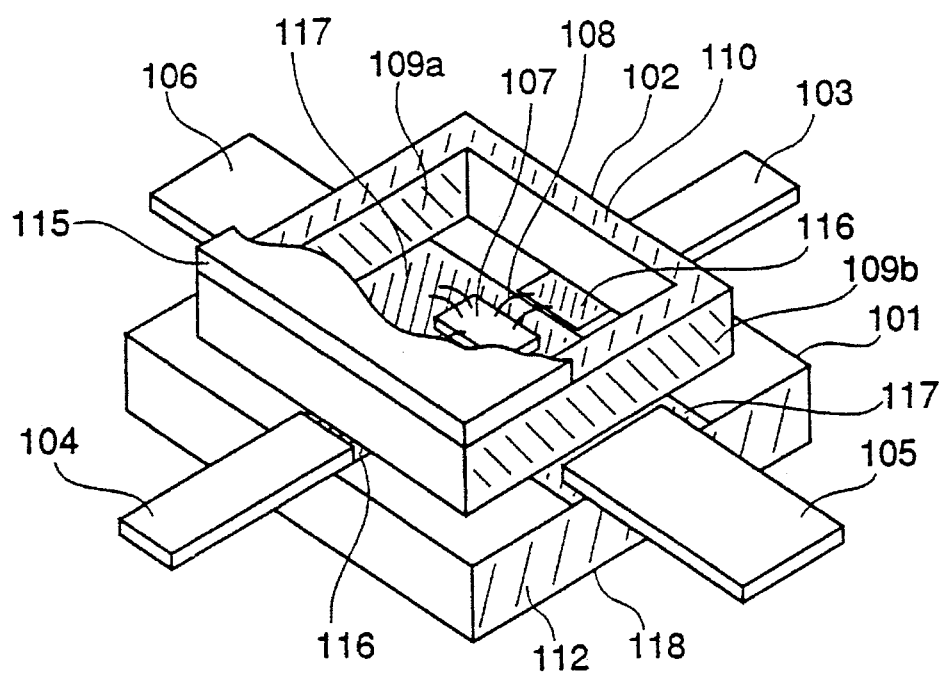
FIG. 8 is a perspective view showing a structure of a conventional semiconductor device.

In addition, although the metal plate is bonded to the sealing cover in the above third embodiment of the present invention, there can be provided an integral member 11a consisting of the frame member 10a shown in FIG. 6 in the second embodiment and the cover 4 connected to the member 10a and fit in the package as shown in FIG. 7. In this case also, the same effect as in the third embodiment of the present invention is obtained.

In addition, although the integral member is provided by bonding the metal plate to the cover in the third embodiment of the present invention, the integral member may be integrally formed in the present invention. In this case, the manufacturing process of the integral member can be simplified, whereby the semiconductor device can be easily formed.

Furthermore, although the metal plate is bonded to the inner side wall of the package by brazing in the above second and third embodiments, the metal plate may be bonded by an elastic bonding agent such as a resin. In a case where the metallization layer is formed on the inner side wall of the package or the metal plate is brazed, since the coefficient of heat expansion of the metallization layer or the metal plate is different from that of the upper and lower ceramic frames, when the temperature of the semiconductor device rises at the time of high-output operation, the expanded metallization layer or the metal plate pulls the upper and lower ceramic frames, whereby the package could be destroyed. However, when the metal plate is bonded by an elastic bonding agent, since the difference in coefficient of expansion between the metal plate and the ceramic can be adjusted by the bonding agent, the package can be prevented from being destroyed, whereby there can be provided the semiconductor device having high reliability with a change in temperature. Furthermore, when the metal plate is bonded by the bonding agent, it becomes possible to use an inexpensive metal material having a high coefficient of heat expansion for the metal plate, whereby there can be inexpensively provided a semiconductor device having preferable heat dissipation properties at the time of high-output operation and preferable high-frequency characteristics.

In addition, the metal plate may be bonded to the base member by an electrically conductive bonding agent. In this case, even when the base member is made of a material having a coefficient of heat expansion different from that of the metal plate, since the elastic conductive bonding agent prevents movement of the bonding part between the base member and the metal plate caused by heat expansion, there is no contact defect between the base member and the metal plate, so that a preferable contacting state can be maintained, whereby there can be provided a semiconductor device having high reliability with a change in temperature.

What is claimed is:

1. A packaged semiconductor device comprising:

a metal base;

a first ceramic frame having a first opening and bonded to said metal base;

a metallization layer providing input and output terminals and disposed on and extending along a longitudinal direction of said first ceramic frame;

a second ceramic frame having a second opening larger than the first opening and bonded to said first ceramic frame and to said metallization layer, the first and second openings being aligned to form a cavity defined by a first pair of inner side walls generally parallel to said metallization layer and a second pair of inner side walls generally transverse to said metallization layer;

metal disposed on and covering each of the first pair of inner side walls of said first and second ceramic frames, not electrically contacting said metallization layer but electrically contacting said base member;

a semiconductor element disposed on said base member within the first opening, said semiconductor element having terminals electrically connected to said metallization layer and a grounding terminal electrically connected to said base member; and a cover hermetically sealing said semiconductor element, bonded to said second ceramic frame, and electrically connected to the metal disposed on said first pair of inner side walls.

2. The packaged semiconductor device according to claim 1 wherein said metal covering each of said first pair of inner side walls comprises a pair of metal plates.

3. The packaged semiconductor device according to claim 2 wherein said metal plates and said cover are unitary.

4. The packaged semiconductor device according to claim 2 including a bonding agent bonding said metal plates to said first pair of inner side walls.

5. The packaged semiconductor device according to claim 2 including an electrically conducting bonding agent bonding and electrically connecting said metal plates to said base member.

6. The packaged semiconductor device according to claim 1 wherein said metal covering each of said first pair of inner side walls comprises a pair of metal films.

7. The packaged semiconductor device according to claim 2 including metal disposed on and covering said second pair of inner side walls and wherein said metal covering each of said second pair of inner side walls comprises a pair of metal plates.

8. The packaged semiconductor device according to claim 7 wherein said metal plates covering each of said first and second pairs of inner side walls are unitary.

9. The packaged semiconductor device according to claim 8 wherein said metal plates and said cover are unitary.

10. The packaged semiconductor device according to claim 6 including metal films disposed on and covering each of said second pair of inner side walls.

* * * * *